United States Patent [19]

Soderlund et al.

[11] Patent Number: 5,655,646
[45] Date of Patent: Aug. 12, 1997

[54] SUPPORT SYSTEM FOR PCB

[75] Inventors: Martin Soderlund, Westboro; Richard Nihan, Dracut, both of Mass.

[73] Assignee: BTU International, N. Billerica, Mass.

[21] Appl. No.: 438,900

[22] Filed: May 10, 1995

[51] Int. Cl.⁶ .................................................. B65G 15/00
[52] U.S. Cl. .................. 198/841; 198/774.4; 198/476.1; 198/813; 198/468.8
[58] Field of Search ............................ 198/774.4, 836.1, 198/837, 841, 817, 476.1, 803.11, 813, 468.8, 631.1, 809

[56] References Cited

U.S. PATENT DOCUMENTS

| | | | |
|---|---|---|---|
| 964,191 | 7/1910 | Steele | 198/817 |
| 1,209,021 | 12/1916 | Phillips | 198/809 |
| 2,169,772 | 8/1939 | Schweitzer | 198/841 |
| 3,159,270 | 12/1964 | Johnston | 198/631.1 |
| 4,206,994 | 6/1980 | Silverberg et al. | 198/841 |
| 4,657,131 | 4/1987 | Brychta et al. | 198/813 |
| 4,741,525 | 5/1988 | Ebmeyer et al. | 198/817 |
| 4,793,472 | 12/1988 | Solond | 198/774.4 |
| 4,844,684 | 7/1989 | Bradley | 198/809 |
| 4,881,584 | 11/1989 | Wislocker et al. | 198/631.1 |
| 5,085,311 | 2/1992 | Garro | 198/809 |
| 5,104,281 | 4/1992 | Corvi | 198/809 |

OTHER PUBLICATIONS

Mark's Standard Handbook for Mechanical Engineers—p. 5-5 (Table 3. Elastic Constants of Metals) Eighth Edition.

*Primary Examiner*—William E. Terrell
*Assistant Examiner*—Khoi H. Tran
*Attorney, Agent, or Firm*—Weingarten, Schurgin, Gagnebin & Hayes LLP

[57] ABSTRACT

A system provides support for the underside of a planar object, such as a printed circuit board. The system includes a flexible loop having an outer face from which support elements protrude. A guide positions the flexible loop to align the support elements with one or more selected locations on the underside of the object. The system can also include a device for moving the guide toward or away from the object as desired. A tensioning element can be provided that is responsive to displacement of the guide to maintain a substantially constant tension on the loop.

12 Claims, 4 Drawing Sheets

SUPPORT SYSTEM FOR PCB

FIELD OF THE INVENTION

The present invention relates to an apparatus for supporting a planar article, and more particularly to a retractable support system for supporting the underside of a printed circuit board (PCB) during transit of the PCB through a furnace.

BACKGROUND OF THE INVENTION

Printed circuit boards, also known as PCB's, can be subjected to a variety of known manufacturing process steps that require planar PCB's to be transported horizontally or flat through a portion of a furnace.

One known apparatus for transporting a PCB horizontally is a moving belt. However, placing a PCB on even a perforate belt limits the exposure of the lower surface of the PCB for processing. Another known transport device includes edge grabbers or supports that move linearly through the furnace. Because edge grabbers hold or support only opposing sides of the PCB, both the upper and lower surfaces of the PCB are exposed for processing. However, edge supporting transport devices have a serious limitation: they provide no support for the underside of the PCB except at the edges. Therefore, depending on the thickness and width of a selected material from which a PCB is fabricated, the center of the PCB can droop or bow downwardly during processing. Sagging at the center of the PCB can preclude correct processing of the PCB, resulting in an elevated product defect rate.

SUMMARY OF THE INVENTION

The present invention overcomes the limitations of present transport devices by providing a system for supporting the underside of a PCB that is suspended by its edges. Support for the PCB is provided by selectively positionable elements having a contact portion with a very small surface area. The elements move in unison with an edge conveyor to remain in a fixed position with respect to the PCB as it moves through a furnace, for example, thereby inhibiting sagging of the PCB, while presenting a minimally intrusive presence within the furnace environment.

In an illustrative embodiment, a system for supporting the underside of a planar object includes a flexible loop having an outer face from which outwardly extending elements are secured and a guide for positioning the loop.

In another embodiment of the invention, a system comprises a flexible loop having an outer face from which elongate elements extending outwardly. A guide that positions the loop is displaced as required by a device to cause localized inward and outward displacement of the loop. A tensioning element is responsive to the displacement of the loop to maintain tension on the loop as required.

In yet another embodiment of the invention, a system comprises two parallel support assemblies, wherein each support assembly includes a flexible loop having outwardly extending support elements and a guide for positioning the loop.

BRIEF DESCRIPTION OF THE DRAWINGS

These and further features of the invention will be better understood with reference to the accompanying specification and drawings in which.

DETAILED DESCRIPTION OF THE INVENTION

Figure 1:
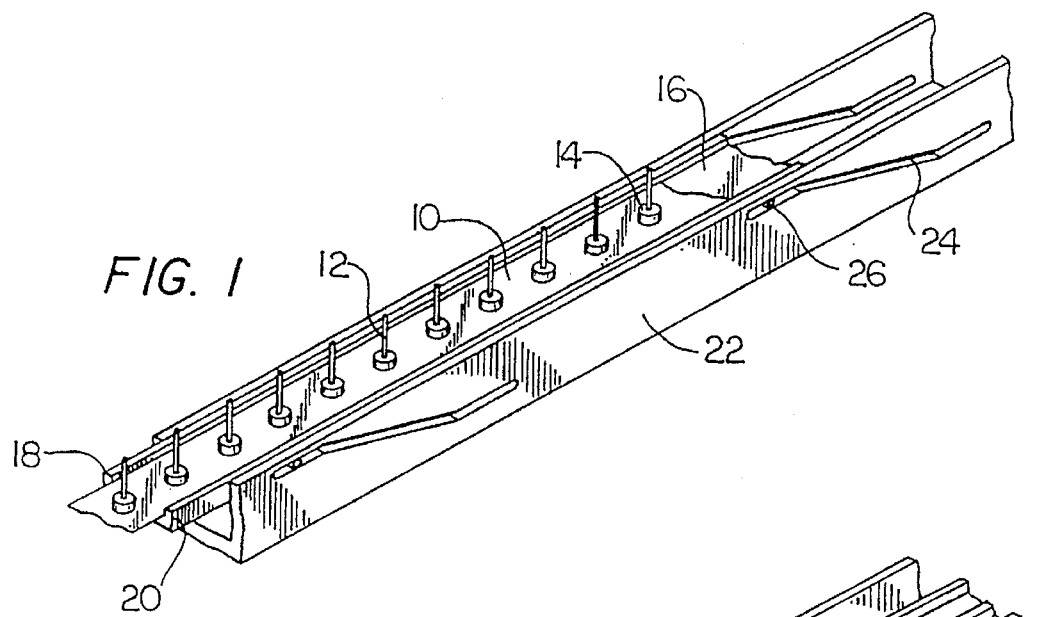
FIG. 1 is a perspective view of a portion of a support system in a raised position.

Referring to FIG. 1, a representative portion of an embodiment of a support system in accordance with the invention is illustrated. The support system comprises a heat tolerant material such as Alloy 17-7 SST that can be configured as a flexible loop 10 having an inner face and an outer face.

Support elements 12 are secured to and extend outwardly from the outer face of the loop 10. Although, the support elements 12 can be an integral part of the loop 10, the loop can be alternatively provided with sockets 14 on the outer face of the loop into which the support elements can be removably disposed. Thus, a damaged support element can be easily removed from the loop and replaced with a new support element. The sockets 14 can be positioned on the loop 10 as required to align the support elements 12 with predetermined contact or support locations on the underside of a PCB. Various shapes for the support elements 12 are functional, however, a cylindrical pin having a small surface area at its distal end provides both functional and cost advantages. For example, a small surface area permits precise placement on the underside of a PCB. This is particularly advantageous for supporting a PCB having a crowded underside or which only has points available for support rather than broad, open spaces.

A guide 16 supports and positions the loop 10. The guide 16 can include one or more elements for inhibiting lateral movement of the loop 10. In the illustrated embodiment, the guide 16 is an open-ended, planar track or channel made of a heat resistant metal or alloy, or a refractory ceramic, and the elements for inhibiting lateral movement include upwardly extending side elements 18 and 20. Thus, the loop 10, disposed on the guide 16, is only longitudinally movable with respect to the guide.

The support system can further include a device 22 for moving the guide 16 to cause localized displacement of the loop 10, either outward (up) or inward (down) with respect to the interior of the loop. The ability to move the guide 16 allows the height of support elements 12 to be adjusted as required. Also, the guide 16 can be completely retracted when it is not needed.

In the illustrated embodiment, the device 22 includes a rail having at least one ramp or track 24 adapted to receive or engage a portion of, or one or more protrusions from, the guide 16, such as a lug 26 that is movable within the track. Similarly, the guide 16 can include a track that is adapted to receive or engage a protrusion from the rail. In the portion of the support system illustrated in FIG. 1, two pairs of opposing tracks 24 are provided, each track having an upper end and a lower end. Thus, when the guide 16 is moved longitudinally, using any of a number of mechanical devices known to those skilled in the art, the guide moves from a first position to a second position, thereby moving the guide and the loop disposed thereon inward or outward. FIG. 1 illustrates the guide 16 positioned to place it in a raised position. Other embodiments of the invention can include actuators that directly act upon the guide 16 to move it and do not include the device 22. However, the device 22 provides significant lateral stability to the guide 16 nested therein.

Figure 2:
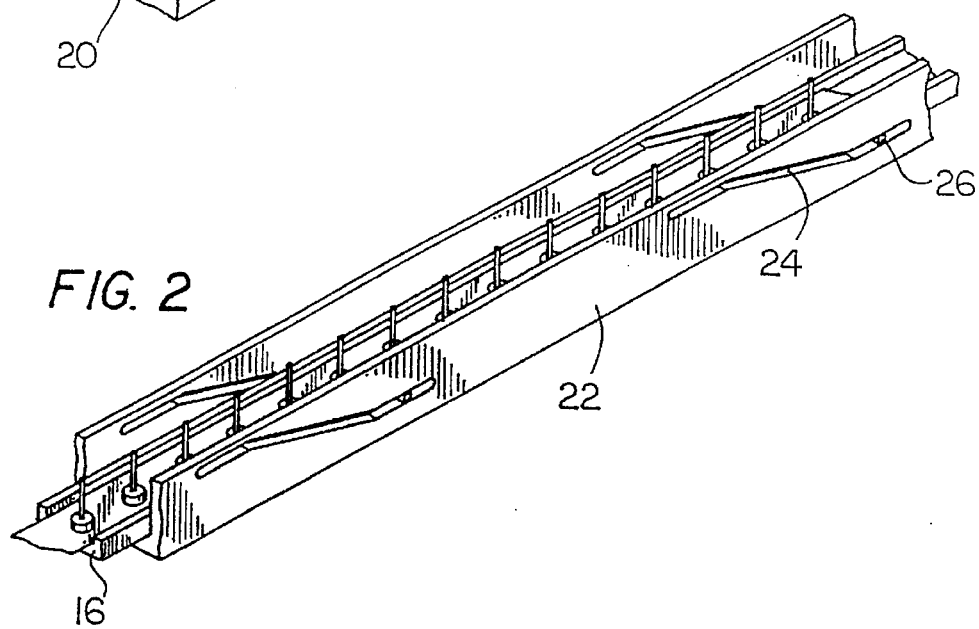
FIG. 2 is a perspective view of the portion of the support system of FIG. 1 in a lowered position.
Figure 3:
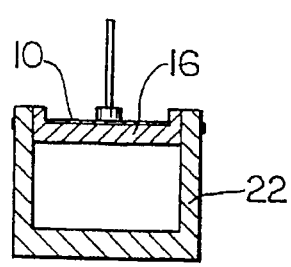
FIG. 3 is an end view of the support system of FIG. 1 in a raised position.
Figure 4:
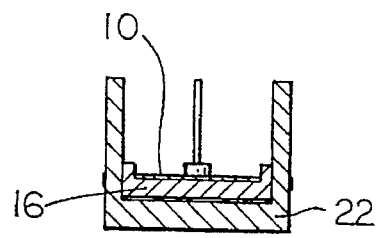
FIG. 4 is an end view of the support system of FIG. 1 in a lowered position.

Referring to FIG. 2, the guide has been moved to place it in a lowered position. In this view, the lugs 26 are visible at the lower ends of the tracks 24. It should be noted that although many different configurations for the tracks 24 and lugs 26 are contemplated, their primary function is to facilitate vertical repositioning of the guide 16. FIG. 3 and FIG. 4 are end views of the support system which illustrate vertical repositioning of the guide 16. FIG. 3 shows the guide 16 in a raised position, and FIG. 4 shows the guide in a lowered position. In one embodiment of the invention, the vertical displacement of the guide 16 is about one inch. However, the lugs 26 can be stopped or positioned anywhere on the incline of the tracks 24 to obtain a precise vertical displacement of the guide 16. This provides a particular advantage if it is desired to align a support element 12 with a downwardly projecting portion of a PCB or component mounted to the lower surface of the PCB which is not co-planar with other portions of the underside of the PCB.

Figure 5:
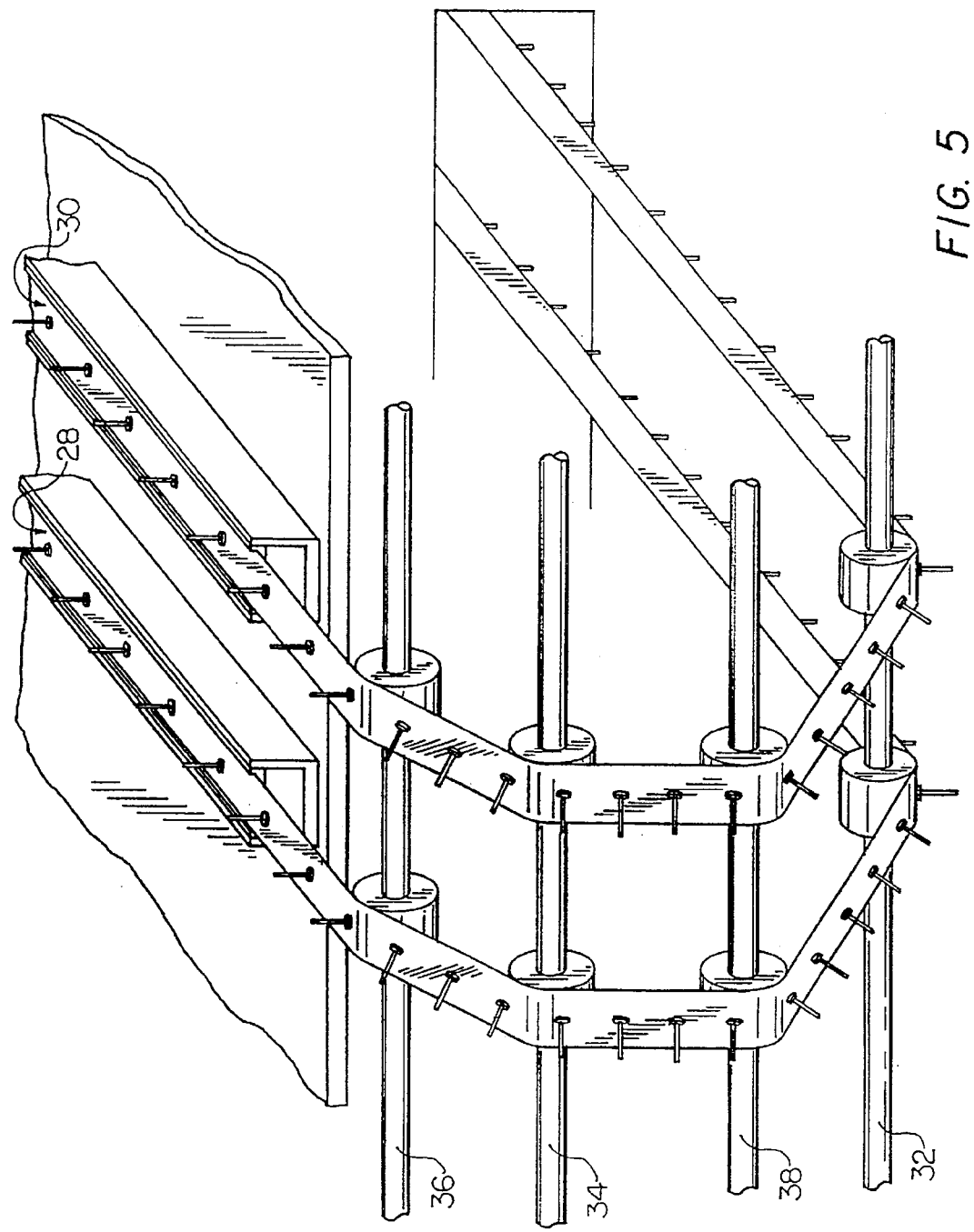
FIG. 5 is a perspective view of an embodiment of the support system having two support assemblies.

Depending on the characteristics of the PCB to be processed, more than one support assembly comprising a loop 10, support elements 12, and guide 16 can be provided. FIG. 5 illustrates a support system having a first and a second support assembly, 28 and 30 respectively, spaced apart and parallel to each other, wherein the structure and function of each of the assemblies is substantially identical.

Regardless of the number of support assemblies, the support system can further include one or more a tensioning elements that are responsive to localized movement of the loop 10 when the guide 16 is repositioned. For example, when the guide 16 is moved outward with respect to the interior of the loop (upward), the substantially inelastic loop 10 must move inward at some point along the loop in order for the loop to maintain a constant circumference.

Figure 6:
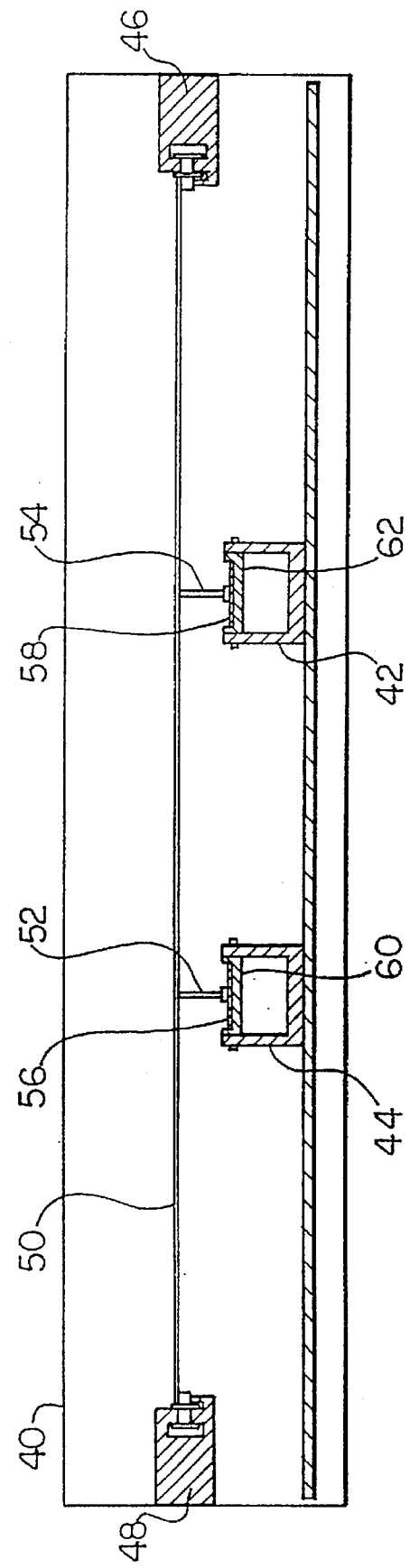
FIG. 6 is a sectional view of a portion of a furnace including an embodiment of the support system having two support assemblies, and illustrating a PCB being supported along its underside by the support system.

FIG. 5 illustrates an exemplary tension device 32, idler or guide rollers 34 and 36, and a drive roller 38 for a system having two loops 10. The tension device 32 can be a freely rotatable roller that is outwardly biased with spring, hydraulic, or pneumatic elements known to those skilled in the art, to maintain consistent tension on the loop 10. The drive roller 38 is engagable with a fixed or variable speed motor which is responsive to a loop drive controller. Idler rollers 34 and 36 are mounted so that they rotate freely. FIG. 6 is a sectional view of the interior of a furnace muffle 40 that includes an embodiment of the support system having two support assemblies 42 and 44. Edge support and conveyance mechanisms 46 and 48 suspend a PCB 50 within the furnace muffle 40 by its edges. The support assemblies 42 and 44 are shown in the raised position so that support elements 52 and 54 contact the lower surface of the PCB. As the PCB is conveyed through the furnace muffle 40 by the edge support and conveyance mechanisms 46 and 48, the loops 56 and 58 are slid through their respective guides 60 and 62 at the same speed so that the support elements 52 and 54 do not move with respect to the PCB.

Figure 7:
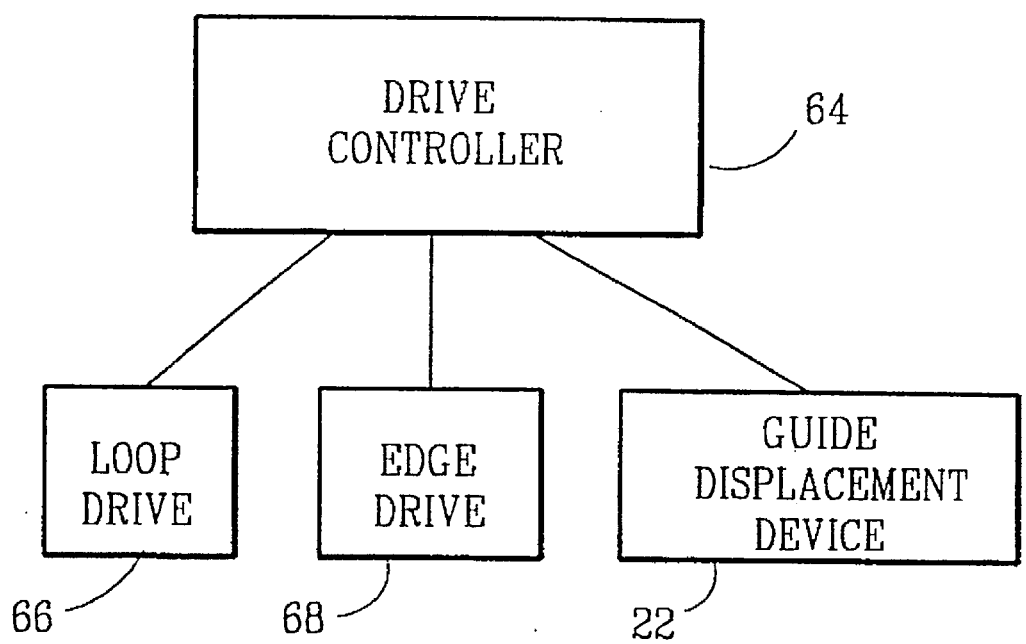
FIG. 7 is a block diagram of an exemplary control arrangement for the system.

FIG. 7 is a block diagram of an exemplary control configuration for the system, wherein a drive controller 64, responsive to operator input, controls activation of a loop drive 66, an edge drive 68, and the guide displacement device 22.

In addition to the foregoing advantages of the support system, the low mass of the loop and support element combination allows the loop to be easily driven by a relatively small motor, with little or no lubrication of the loop/guide interface. Additionally, the simplicity of the support assembly results in low maintenance requirements and the ability to operate in tight areas at high temperatures.

Although the invention has been shown and described with respect to exemplary embodiments thereof, various other changes, omissions and additions, in form and detail thereof may be made therein without departing from the spirit and scope of the invention.

What is claimed is:

1. A system for supporting the underside of a planar object comprising:
    a flexible loop having an inner face and an outer face;
    a plurality of elements secured to and extending outwardly from said outer face of said flexible loop;
    a guide for positioning said flexible loop; and
    a device for displacing said guide to cause localized inward and outward displacement of said flexible loop with respect to the interior of said flexible loop;
    wherein said guide is nestable within said device to inhibit lateral movement of said guide and wherein said guide is slidable along a path within said device between a first position and a second position for causing said localized inward and outward displacement of said flexible loop, wherein said path includes an incline portion and a horizontal portion.

2. The system of claim 1, wherein said flexible loop comprises an elastically deformable metal.

3. The system of claim 1, wherein each of said plurality of elements includes a cylindrical pin.

4. The system of claim 1, wherein said cylindrical pin is selectably repositionable on said outer face of said flexible loop.

5. The system of claim 1, wherein said flexible loop includes a plurality of sockets on said outer face into which said plurality of elements are removably disposed.

6. The system of claim 1, wherein said guide comprises an element for inhibiting lateral movement of said loop.

7. The system of claim 1, wherein said guide includes an open-ended, planar track.

8. The system of claim 7, wherein said guide includes upwardly extending side elements.

9. The system of claim 1, further including a tensioning element responsive to said inward and outward displacement of said flexible loop to maintain a substantially constant tension on said flexible loop.

10. A system for supporting the underside of a planar object comprising:
    a flexible loop having an inner face and an outer face;
    a plurality of elements secured to and extending outwardly from said outer face of said flexible loop;
    a guide for positioning said flexible loop;
    a device having said guide nested therein, said device for displacing said guide to cause localized inward and outward displacement of said flexible loop with respect to the interior of said flexible loop;
    wherein said guide is nestable within said device to inhibit lateral movement of said guide;
    wherein said guide is longitudinally slidable within said device from a first position to a second position; and wherein said guide includes a lug projecting laterally into a track of said device adapted to engage said lug.

11. A system for supporting the underside of a PCB for transport through a furnace comprising:

a flexible loop having an inner face and an outer face;

a plurality of elongate elements secured to and extending outwardly from said outer face of said flexible loop;

a guide for positioning said flexible loop having a raised position and a lowered position;

a device for displacing said guide along a path between said lowered position and said raised position to cause localized inward and outward displacement of said flexible loop with respect to the interior of said flexible loop, wherein said path includes an inclined portion and a horizontal portion; and a tensioning element responsive to said inward and outward displacement of said flexible loop to maintain a substantially constant tension on said flexible loop.

12. A system for supporting the underside of a PCB for transport through a furnace comprising:

a flexible loop having an inner face and an outer face;

a plurality of elongate elements secured to and extending outwardly from said outer face of said flexible loop;

an open-ended planar track for positioning said flexible loop;

a device for displacing said track to cause localized inward and outward displacement of said flexible loop with respect to the interior of said flexible loop, said track is nestable within said device to inhibit lateral movement of said track, and said track is longitudinally slidable within said device along a path having an incline portion and a horizontal portion; and a tensioning element responsive to said inward and outward displacement of said flexible loop to maintain a substantially constant tension on said flexible loop.

* * * * *